United States Patent
Chen et al.

(10) Patent No.: US 12,454,977 B2
(45) Date of Patent: Oct. 28, 2025

(54) SLIDE RAIL ASSEMBLY

(71) Applicants: King Slide Works Co., Ltd., Kaohsiung (TW); King Slide Technology Co., Ltd., Kaohsiung (TW)

(72) Inventors: Ken-Ching Chen, Kaohsiung (TW); Shun-Ho Yang, Kaohsiung (TW); Tzu-Cheng Weng, Kaohsiung (TW); Chun-Chiang Wang, Kaohsiung (TW)

(73) Assignees: King Slide Works Co, Ltd., Kaohsiung (TW); King Slide Technology Co, Ltd., Kaohsiung (TW)

( * ) Notice: Subject to any disclaimer, the term of this patent is extended or adjusted under 35 U.S.C. 154(b) by 153 days.

(21) Appl. No.: 18/495,003

(22) Filed: Oct. 26, 2023

(65) Prior Publication Data

US 2024/0410421 A1    Dec. 12, 2024

(30) Foreign Application Priority Data

Jun. 8, 2023    (TW) .................................. 112121765

(51) Int. Cl.
*F16C 29/02* (2006.01)
*A47B 88/483* (2017.01)
*H05K 7/14* (2006.01)

(52) U.S. Cl.
CPC ............ *F16C 29/02* (2013.01); *A47B 88/483* (2017.01); *H05K 7/1489* (2013.01); *A47B 2210/0018* (2013.01)

(58) Field of Classification Search
CPC ..... F16C 29/02; H02K 7/1489; A47B 88/483; A47B 2210/0018
See application file for complete search history.

(56) References Cited

U.S. PATENT DOCUMENTS

| | | | |
|---|---|---|---|
| 3,039,837 A | 6/1962 | Poe | |
| 10,376,054 B1 * | 8/2019 | Chen | ...................... A47B 88/50 |
| 2016/0157376 A1 * | 6/2016 | Franz | ................... G11B 33/128 |
| | | | 361/679.02 |
| 2018/0116068 A1 | 4/2018 | Lee et al. | |
| 2019/0174642 A1 | 6/2019 | Choyikkunnil et al. | |
| 2019/0298060 A1 * | 10/2019 | Chen | ................... A47B 88/483 |
| 2021/0315125 A1 | 10/2021 | Lin | |
| 2022/0369478 A1 | 11/2022 | Li et al. | |

* cited by examiner

*Primary Examiner* — Phillip A Johnson
(74) *Attorney, Agent, or Firm* — Best & Flanagan LLP

(57) ABSTRACT

A slide rail assembly includes a first rail, a supporting feature, a second rail and a handle. The supporting feature is arranged on one of the first rail and the second rail. The handle is movably mounted on the other one of the first rail and the second rail. When the handle is moved from a first operating position to a second operating position, the handle is configured to contact the supporting feature in order to drive the second rail to move from a predetermined position along a direction.

20 Claims, 10 Drawing Sheets

SLIDE RAIL ASSEMBLY

BACKGROUND OF THE INVENTION

1. Field of the Invention

The present invention relates to a slide rail mechanism, and more particularly, to a slide rail assembly with a handle.

2. Description of the Prior Art

US publication number US 2022/0369478 A1 discloses a handle module arranged on a server. Furthermore, the handle module comprises a handle having a sliding column assembly. The sliding column assembly is pivotally arranged relative to a plate member and movable relative to the plate member. The plate member comprises two plates stacked one above the other. Each of the plates is provided with holes in different directions for mounting the sliding column assembly. With such arrangement, a user can push the handle to mount the server in a rack.

However, in order to meet diverse requirements of the market, it is important to develop various products.

SUMMARY OF THE INVENTION

The present invention aims to provide a slide rail assembly with a supporting feature and a handle.

According to an embodiment of the present invention, a slide rail assembly comprises a first rail, a bracket, a supporting feature, a second rail and a handle. The bracket is arranged on the first rail. The supporting feature is arranged on one of the bracket and the first rail. The second rail is movable relative to the first rail. The handle is movable relative to the second rail. When the handle is moved from a first operating position to a second operating position, the handle is configured to contact the supporting feature in order to drive the second rail to move from a first predetermined position to a second predetermined position relative to the first rail.

According to another embodiment of the present invention, a slide rail assembly comprises a first rail, a second rail, a supporting feature and a handle. The second rail is configured to be located at a retracted position relative to the first rail. The supporting feature is arranged on one of the first rail and the second rail. The handle is movably mounted on the other one of the first rail and the second rail. When the handle is moved from a first operating position to a second operating position, the handle is configured to contact the supporting feature in order to drive the second rail to move away from the retracted position relative to the first rail along an opening direction.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
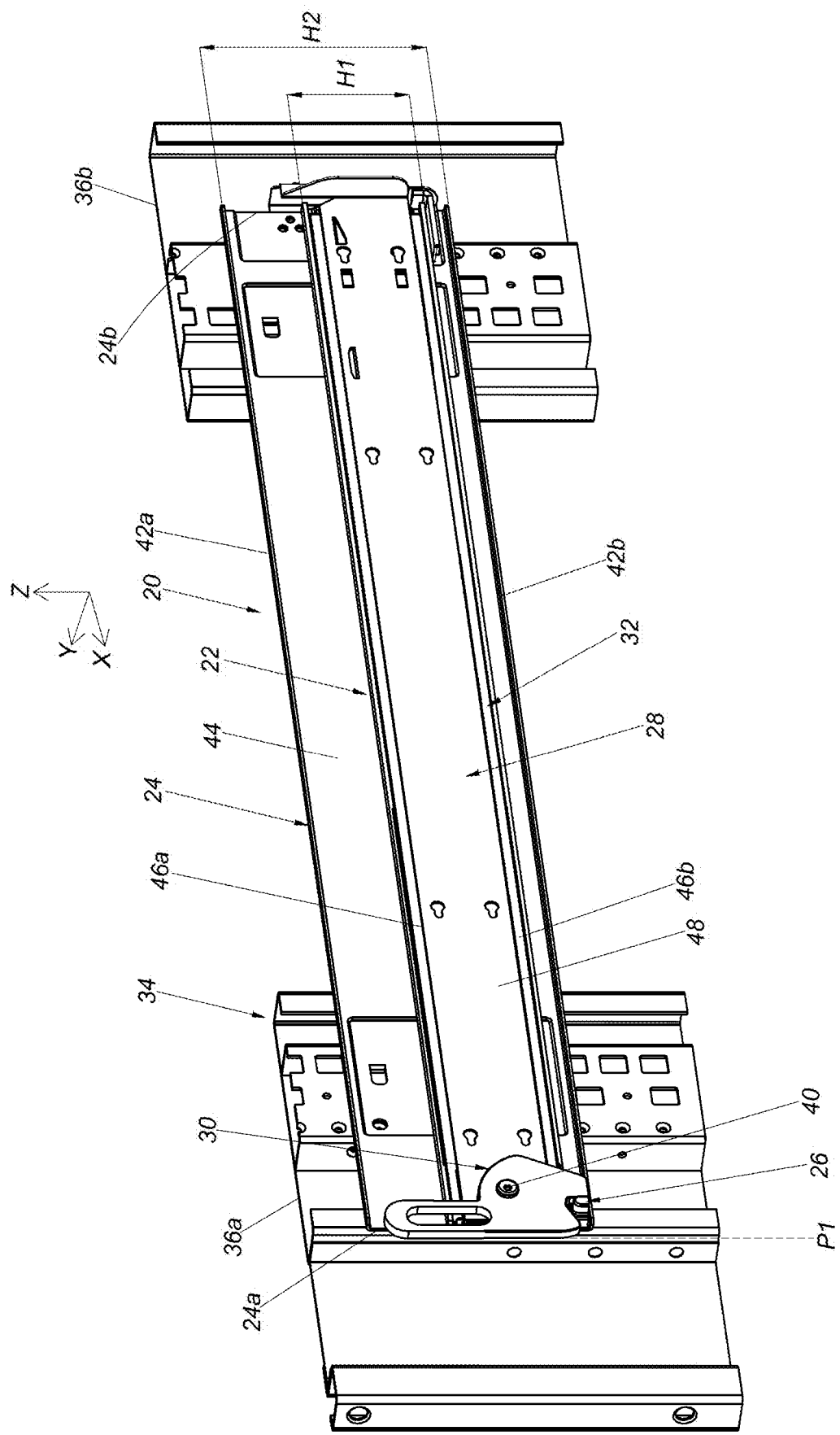
FIG. 1 is diagram showing a slide rail assembly being mounted to a rack according to a first embodiment of the present invention.
Figure 2:
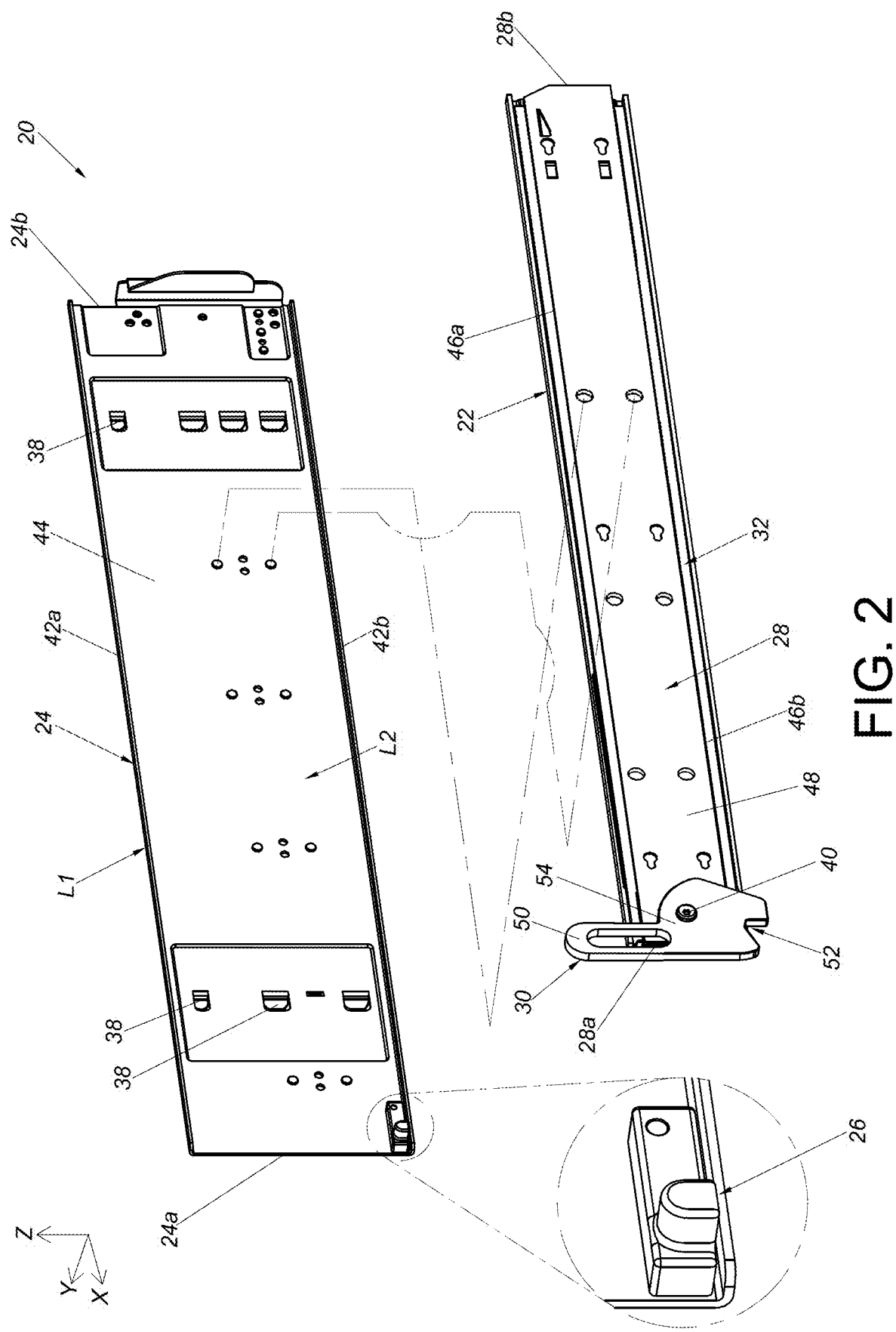
FIG. 2 is an exploded view of the slide rail assembly according to the first embodiment of the present invention.

As shown in FIG. 1 and FIG. 2, a slide rail assembly 20 comprises a first rail 22, a bracket 24, a supporting feature 26, a second rail 28 and a handle 30 according to a first embodiment of the present invention. Preferably, the slide rail assembly 20 further comprises a third rail 32 (such as a middle rail) movably mounted between the first rail 22 (such as an outer rail) and the second rail 28 (such as an inner rail), and the third rail 32 is configured to extend a longitudinal moving distance of the second rail 28 relative to the first rail 22. In the present embodiment, the X axis is a longitudinal direction (or a length direction or moving direction of the slide rail), the Y axis is a transverse direction (or a lateral direction of the slide rail), and the Z axis is a vertical direction (or a height direction of the slide rail).

The bracket 24 is arranged on the first rail 22, and the first rail 22 is configured to be mounted to at least one post (such as a first post 36a and a second post 36b) of a rack 34 through the bracket 24. In the present embodiment, the bracket 24 has a first side L1 and a second side L2 opposite to each other. The first side L1 of the bracket 24 is configured to be mounted to at least one corresponding feature (such as a mounting hole) of the rack 34 through at least one mounting feature 38 (such as an extension part, a bolt or the like as shown in FIG. 2). Such configuration is well known to those skilled in the art, for simplification, no further illustration is provided. The second side L2 of the bracket 24 is connected to a first side (such as a back side) of the first rail 22, but the present invention is not limited thereto. The third rail 32 and the second rail 28 are located on a second side of the first rail 22. Moreover, since the bracket 24 is connected (such as fixedly connected) to the first rail 22, the bracket 24 can be seen as a part of the first rail 22, or the bracket 24 and the first rail 22 can be seen as one piece.

The supporting feature 26 is arranged on one of the first rail 22 and the second rail 28. In the present embodiment, the supporting feature 26 is arranged on the bracket 24 of the first rail 22, but the present invention is not limited thereto. The bracket 24 has a first end part 24a (such as a front end part) and a second end part 24b (such as a rear end part) opposite to each other. The supporting feature 26 is adjacent to the first end part 24a of the bracket 24.

The second rail 28 is configured to be located at a first predetermined position P1 (such as a retracted position as shown in FIG. 1, but the present invention is not limited thereto) relative to the first rail 22.

The handle 30 is movable relative to the first rail 22 and the second rail 28. In the first embodiment, the handle 30 is movably mounted on the second rail 28.

Preferably, in the first embodiment, the supporting feature 26 is fixed to one of the bracket 24 and the first rail 22. For example, the supporting feature 26 is fixed to the bracket 24. Furthermore, the supporting feature 26 is a protrusion, and the supporting feature 26 can be an additional part fixed to the bracket 24; or the supporting feature 26 can be directly integrated onto the bracket 24, but the present invention is not limited thereto.

Preferably, the first rail has a 22 first predetermined height H1. The bracket 24 comprises a first part 42a, a second part 42b and a longitudinal part 44 connected between the first part 42a and the second part 42b of the bracket 24. A second predetermined height H2 is defined between the first part 42a and the second part 42b of the bracket 24 and is greater than the first predetermined height H1 (as shown in FIG. 1).

Preferably, the bracket 24 is connected to the first rail 22 through the longitudinal part 44.

Preferably, the supporting feature 26 is arranged on the longitudinal part 44 of the bracket 24, and the supporting feature 26 is located adjacent to the second part 42b of the bracket 24.

Preferably, the supporting feature 26 is located adjacent to the first end part 24a of the bracket 24.

Preferably, the second rail 28 comprises a first wall 46a, a second wall 46b and a longitudinal wall 48 connected between the first wall 46a and the second wall 46b of the second rail 28. On the other hand, the second rail 28 has a first end part 28a and a second end part 28b opposite to each other. The handle 30 is movably mounted on the longitudinal wall 48 of the second rail 28. For example, the handle 30 is pivotally connected to the longitudinal wall 48 of the second rail 28 through a shaft member 40, and the handle 30 is adjacent to the first end part 28a (such as a front end part) of the second rail 28 for convenience of a user.

Preferably, the handle 30 comprises an operating part 50, a corresponding part 52 and a main body part 54 connected between the operating part 50 and the corresponding part 52. At least one portion of the operating part 50 exceeds (or is higher than) the first rail 22. The corresponding part 52 is configured to interact with the supporting feature 26. The main body part 54 is pivotally connected to the longitudinal wall 48 of the second rail 28 through the shaft member 40.

Preferably, the shaft member 40 is arranged on the longitudinal wall 48 of the second rail 28 transversely (or in a lateral direction of the slide rail, that is, the Y-axis direction), such that the user can easily move the handle 30 through the operating part 50.

Figure 3:
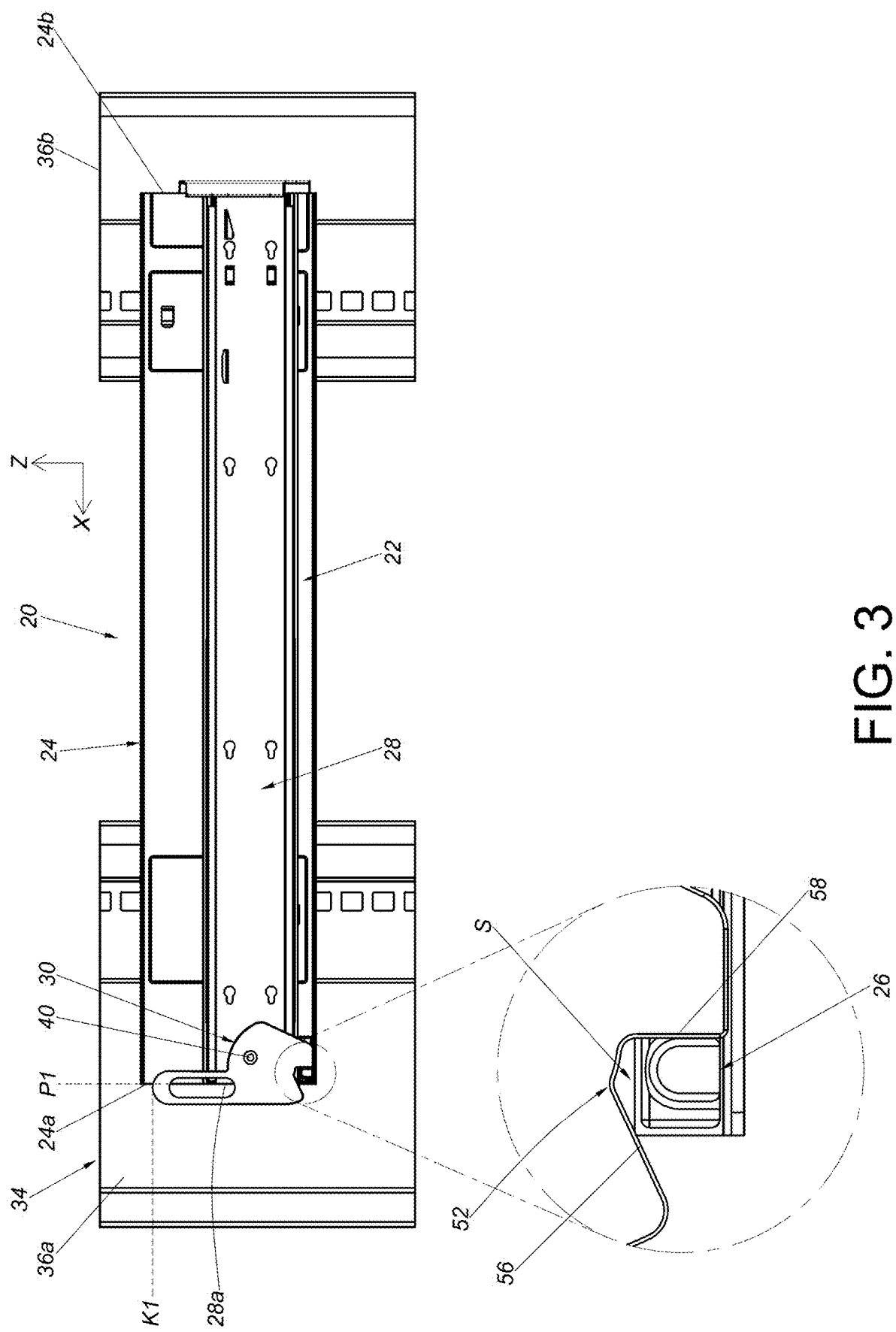
FIG. 3 is a diagram showing a second rail of the slide rail assembly being located at a first predetermined position relative to a first rail according to the first embodiment of the present invention.

As shown in FIG. 3, the corresponding part 52 of the handle 30 comprises a first corresponding section 56 and a second corresponding section 58, and a predetermined space S is defined between the second corresponding section 58 and the first corresponding section 56. When the second rail 28 is located at the first predetermined position P1 relative to the first rail 22 and when the handle 30 is located at a first operating position K1 (such as an initial position or a position before being operated), the supporting feature 26 is located in the predetermined space S.

Figure 4:
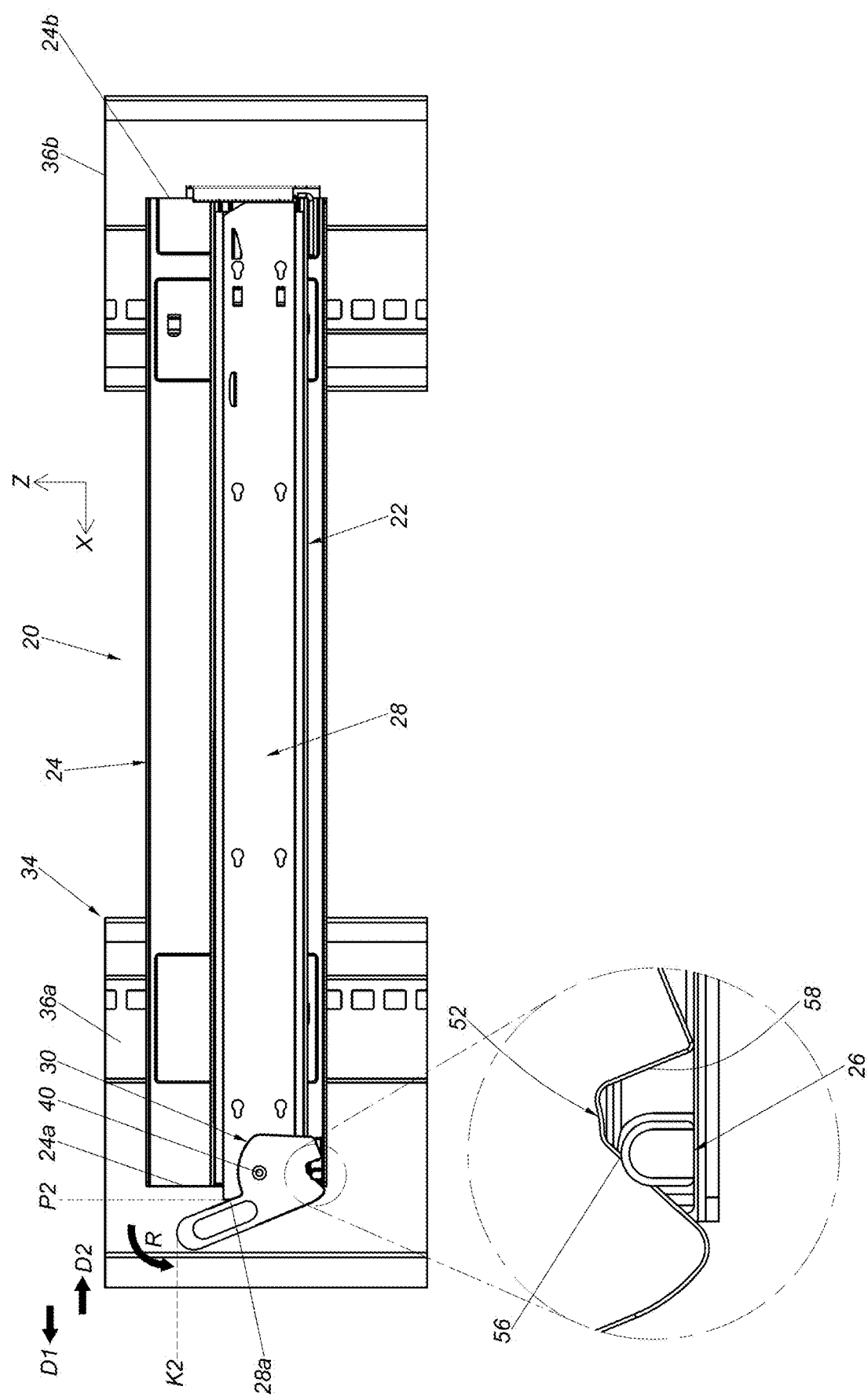
FIG. 4 is a diagram showing a handle being operated to drive the second rail to move to a second predetermined position according to the first embodiment of the present invention.

As shown in FIG. 3 and FIG. 4, during a process of moving the handle 30 from the first operating position K1 (as shown in FIG. 3) to a second operating position K2 (a non-initial position or a position after being operated as shown in FIG. 4), the handle 30 is configured to contact the supporting feature 26, in order to drive the second rail 28 to move away from the first predetermined position P1 along an opening direction D1 (as shown in FIG. 3). For example, the second rail 28 is driven to move from the first predetermined position P1 to a second predetermined position P2 (as shown in FIG. 4).

For example, during a process of the user applying a force on the handle 30 (the operating portion 50 of the handle 30) to move the handle 30 from the first operating position K1 (as shown in FIG. 3) to the second operating position K2 (as shown in FIG. 4) along a predetermined rotation direction R, the handle 30 is configured to continuously contact the supporting feature 26 through the first corresponding section 56 to generate an acting force, such that the second rail 28 is configured to be moved relative to the first rail 22 from the first predetermined position P1 (as shown in FIG. 3) to the second predetermined position P2 (as shown in FIG. 4) along the opening direction D1 in response to the acting force. Therefore, the user can easily open the second rail 28 from the first predetermined position P1 to the second predetermined position P2. For example, when the second rail 28 carries a carried object (such as electronic device, not shown figures), and when the carried object has a loading weight or an electronic plug (or socket) behind the carried object is required to be unplugged from a predetermined device or a predetermined power source, the user can use the handle 30 to open the second rail 28 from the first predetermined position P1 to the second predetermined position P2 with less effort.

Preferably, the first corresponding section 56 of the handle 30 has an inclined surface or an arc surface. Thereby, during the processing of moving the handle 30 from the first operating position K1 to the second operating position K2, the handle 30 can easily cross the support feature 26 through the first corresponding section 56. On the other hand, the second corresponding section 58 of the handle 30 has a wall (such as a vertical wall, but the present invention is not limited thereto).

Moreover, when the second rail 28 is moved relative to the first rail 22 from the second predetermined position P2 (as shown in FIG. 4) along a retracting direction D2 to the first predetermined position P1 (as shown in FIG. 3), the handle 30 continuously contacts the supporting feature 26 through the first corresponding section 56 to generate another acting force, such that the handle 30 is moved from the second operating position K2 back to the first operating position K1.

Figure 5:
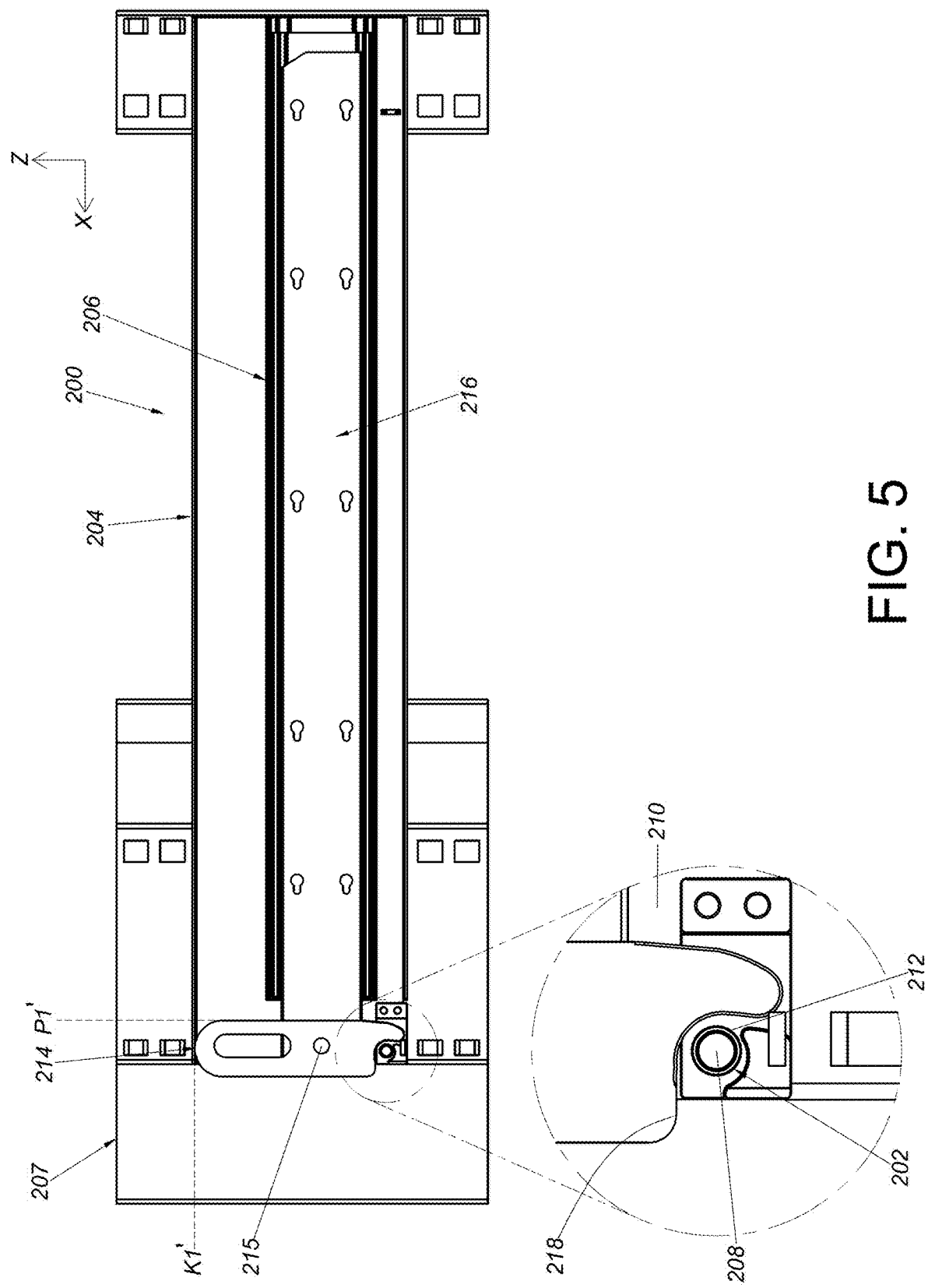
FIG. 5 is a diagram showing a slide rail assembly being mounted to the rack according to a second embodiment of the present invention.
Figure 6:
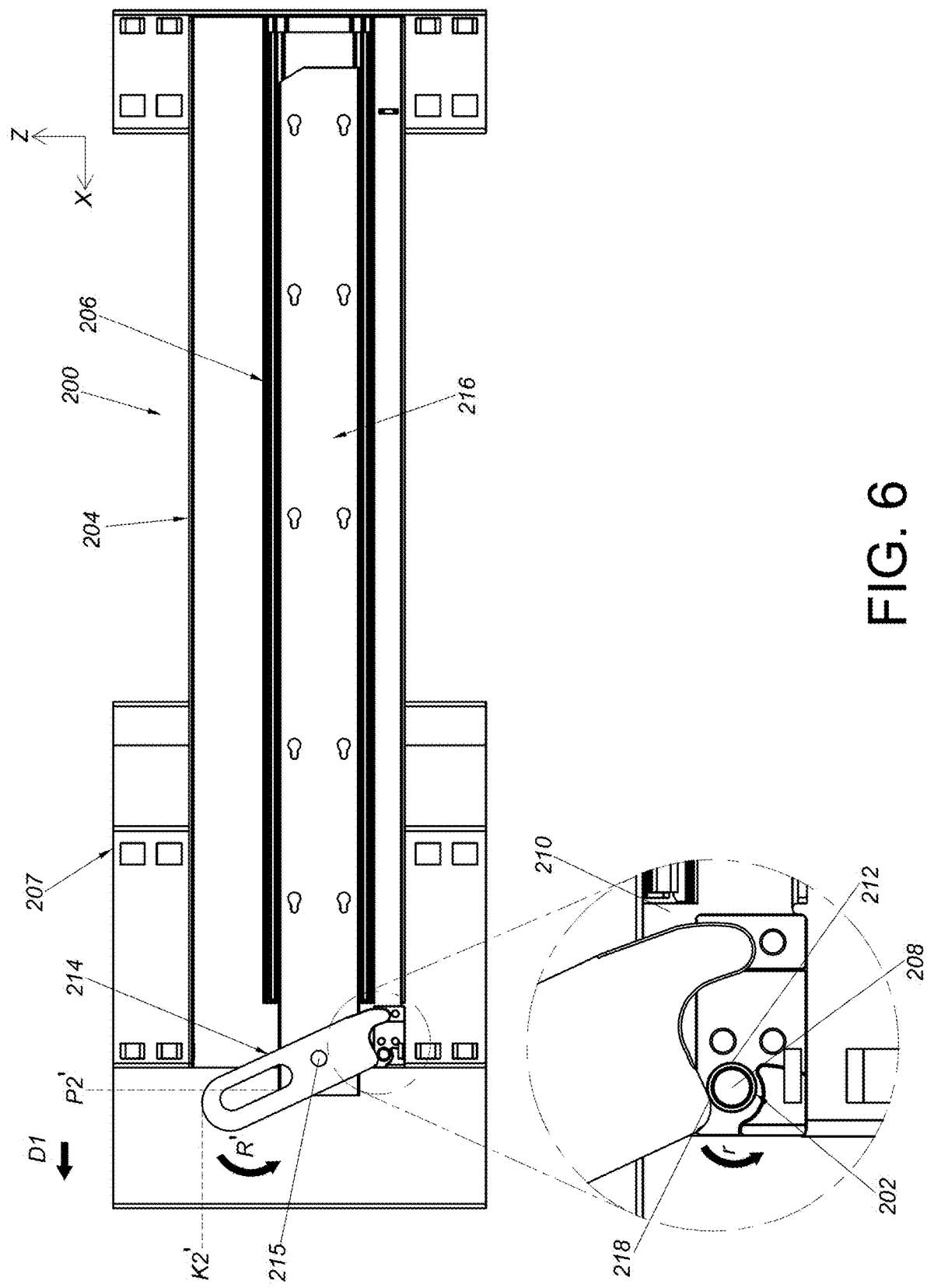
FIG. 6 is a diagram showing a handle being operated to drive a second rail to move to a second predetermined position according to the second embodiment of the present invention.

FIG. 5 and FIG. 6 are diagrams showing a slide rail assembly 200 according to a second embodiment of the present invention. Different from the slide rail assembly 20 of the first embodiment, a supporting feature 202 of the slide rail assembly 200 of the second embodiment is movably mounted to one of a bracket 204 and a first rail 206. In the present embodiment, the supporting feature 202 is movably mounted to the bracket 204, but the present invention is not limited thereto.

Furthermore, the bracket 204 is configured to be mounted to a rack 207. The supporting feature 202 can be a roller, a ball or the like. In the present embodiment, the supporting feature 202 is a roller. For example, the supporting feature 202 is pivotally connected to a longitudinal part 210 of the bracket 204 through an auxiliary shaft 208, such that the supporting feature 202 is pivoted relative to the bracket 204. Preferably, the supporting feature 202 comprises a guiding section 212. The guiding section 212 has an arc surface. In the present embodiment, the supporting feature 202 has a circular profile to provide the arc surface.

During a processing of moving the handle 214 from a first operating position K1' (as shown in FIG. 5) to a second operating position K2' (as shown in FIG. 6) along a predetermined rotation direction R' through a shaft member 215, the handle 214 is configured to contact the supporting feature 202 in order to drive the second rail 216 to move from a first predetermined position P1' (as shown in FIG. 5) to a second predetermined position P2' (as shown in FIG. 6). For example, during a process of the user applying a force on the handle 214 to move the handle 214 from the first operating position K1' to the second operating position K2', the handle 214 is configured to continuously contact the supporting feature 202 through a first corresponding section 218 to generate an acting force, such that the second rail 216 is configured to be moved relative to the first rail 206 from the first predetermined position P1' (as shown in FIG. 5) to the second predetermined position P2' (as shown in FIG. 6) along the opening direction D1 in response to the acting force. Therefore, the second embodiment can achieve substantially the same technical effect as that of the first embodiment.

Moreover, in the second embodiment, the supporting feature 202 can be a movable (such as rotatable) roller. When the handle 214 is moved from the first operating position K1' to the second operating position K2', and when the first corresponding section 218 of the handle 214 contacts the supporting feature 202, the supporting feature 202 is configured to be rotated along a predetermined working direction r through the auxiliary shaft 208 (as shown in FIG. 6, the predetermined working direction r is counterclockwise, but the present invention is not limited thereto), such that it is easier to move the handle 214 from the first operating position K1' to the second operating position K2'. For the user, the handle 214 can be operated with less effort.

Figure 7:
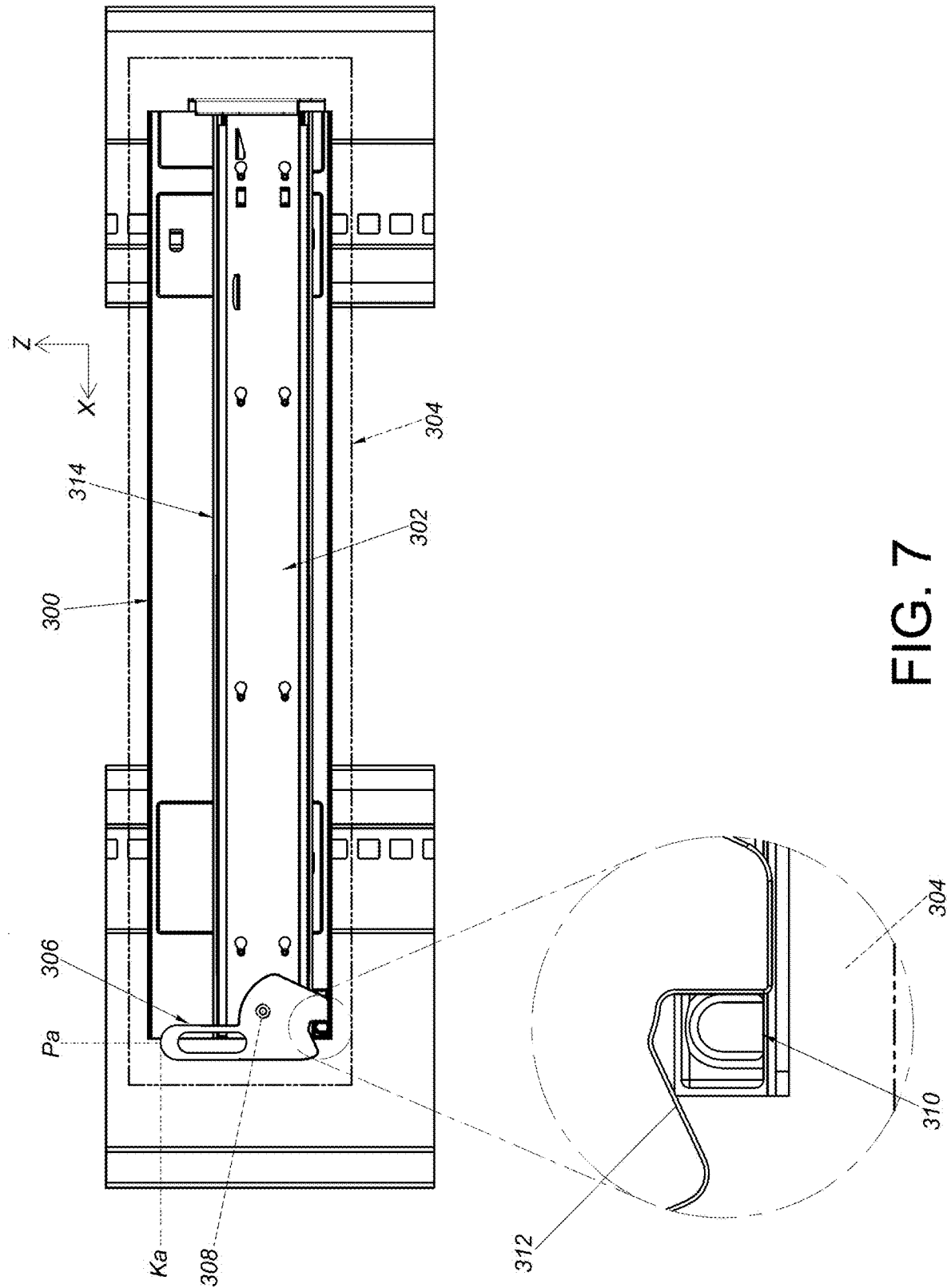
FIG. 7 is a diagram showing a slide rail assembly being mounted to the rack with a second rail being configured to carry a carried object according to a third embodiment of the present invention.
Figure 8:
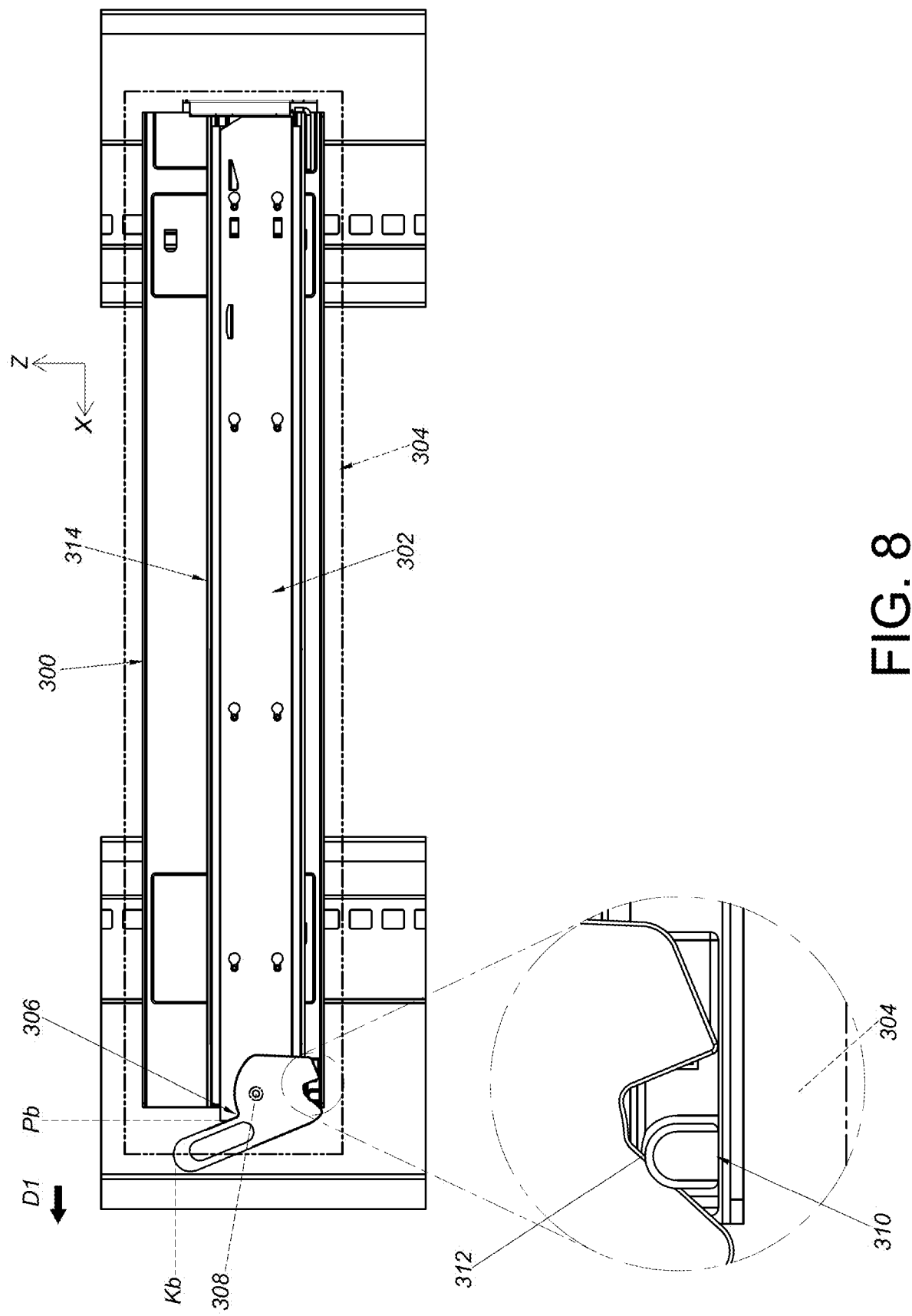
FIG. 8 is a diagram showing a handle being operated to drive the second rail and the carried object to move to the second predetermined position according to the third embodiment of the present invention.

FIG. 7 and FIG. 8 are diagrams showing a slide rail assembly 300 according to a third embodiment of the present invention. Different from the slide rail assembly 20 of the first embodiment, a second rail 302 of the slide rail assembly 300 of the third embodiment is configured to carry a carried object 304, and a handle 306 is movably mounted to the carried object 304. In the present embodiment, the handle 306 is pivotally connected to the carried object 304 through a shaft member 308, but the present invention is not limited thereto. Moreover, the carried object 304 is fixed on the second rail 302, such that the carried object 304 can be seen as a part of the second rail 302, or the carried object 304 and the second rail 302 can be seen as one piece.

During a process of moving the handle 306 from a first operating position Ka (as shown in FIG. 7) to a second operating position Kb (as shown in FIG. 8) along a predetermined rotation direction, the handle 306 is configured to contact the supporting feature 310, in order to drive the second rail 302 (and the carried object 304) to move from a first predetermined position Pa (as shown in FIG. 7) to a second predetermined position Pb (as shown in FIG. 8). For example, during a process of the user applying a force on the handle 306 to move the handle 306 from the first operating position Ka to the second operating position Kb, the handle 306 is configured to continuously contact the supporting feature 310 through the first corresponding section 312 to generate an acting force, such that the second rail 302 is configured to be moved relative to the first rail 314 from the first predetermined position Pa (as shown in FIG. 7) to the second predetermined position Pb (as shown in FIG. 8) along the opening direction D1. Therefore, the third embodiment can achieve substantially the same technical effect as that of the first embodiment. For example, the user can move the second rail 302 (and the carried object 304) from the first predetermined position Pa to the second predetermined position Pb with less effort through the handle 306.

Figure 9:
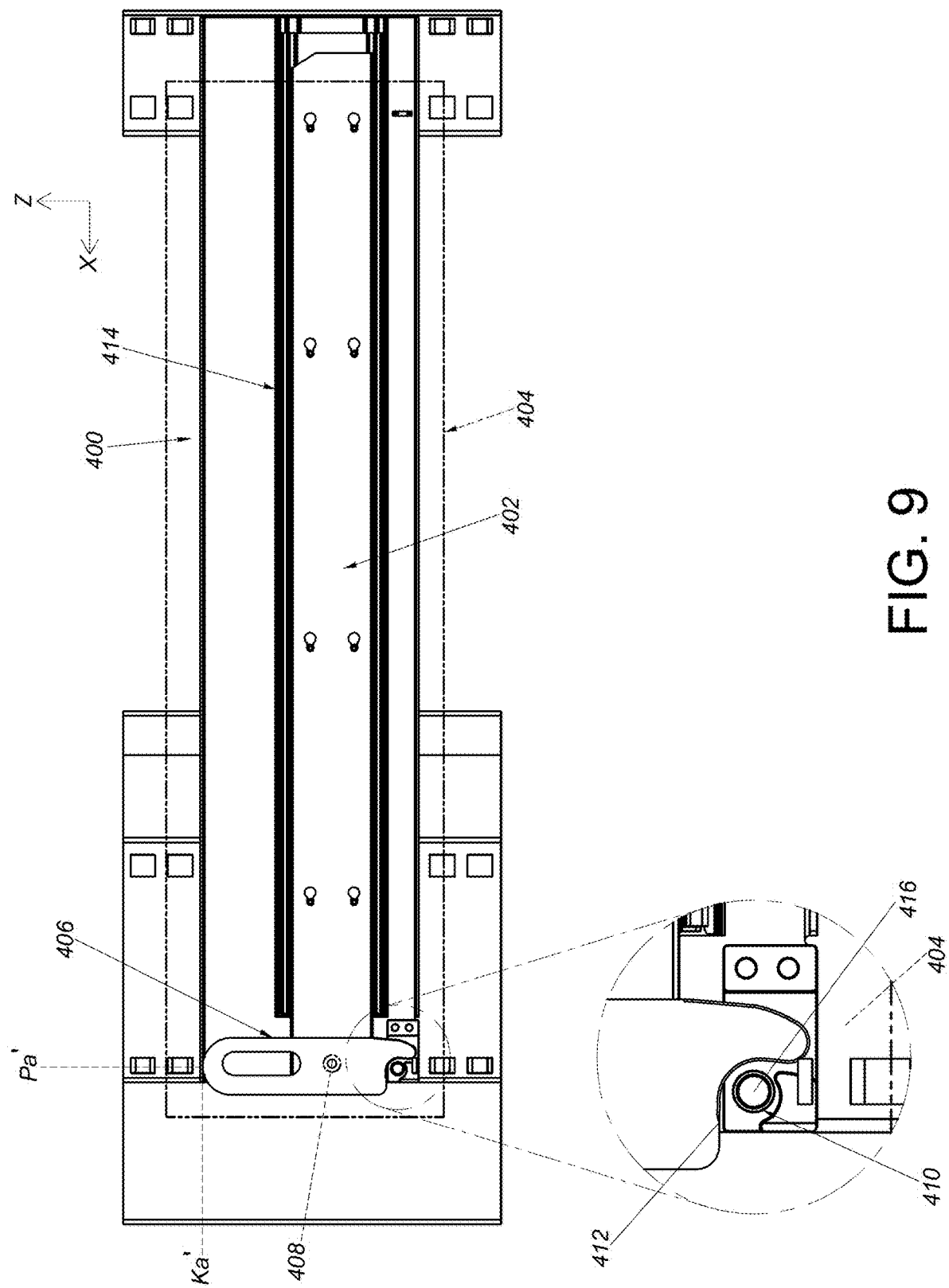
FIG. 9 is a diagram showing a slide rail assembly being mounted to the rack with a second rail being configured to carry a carried object according to a fourth embodiment of the present invention.
Figure 10:
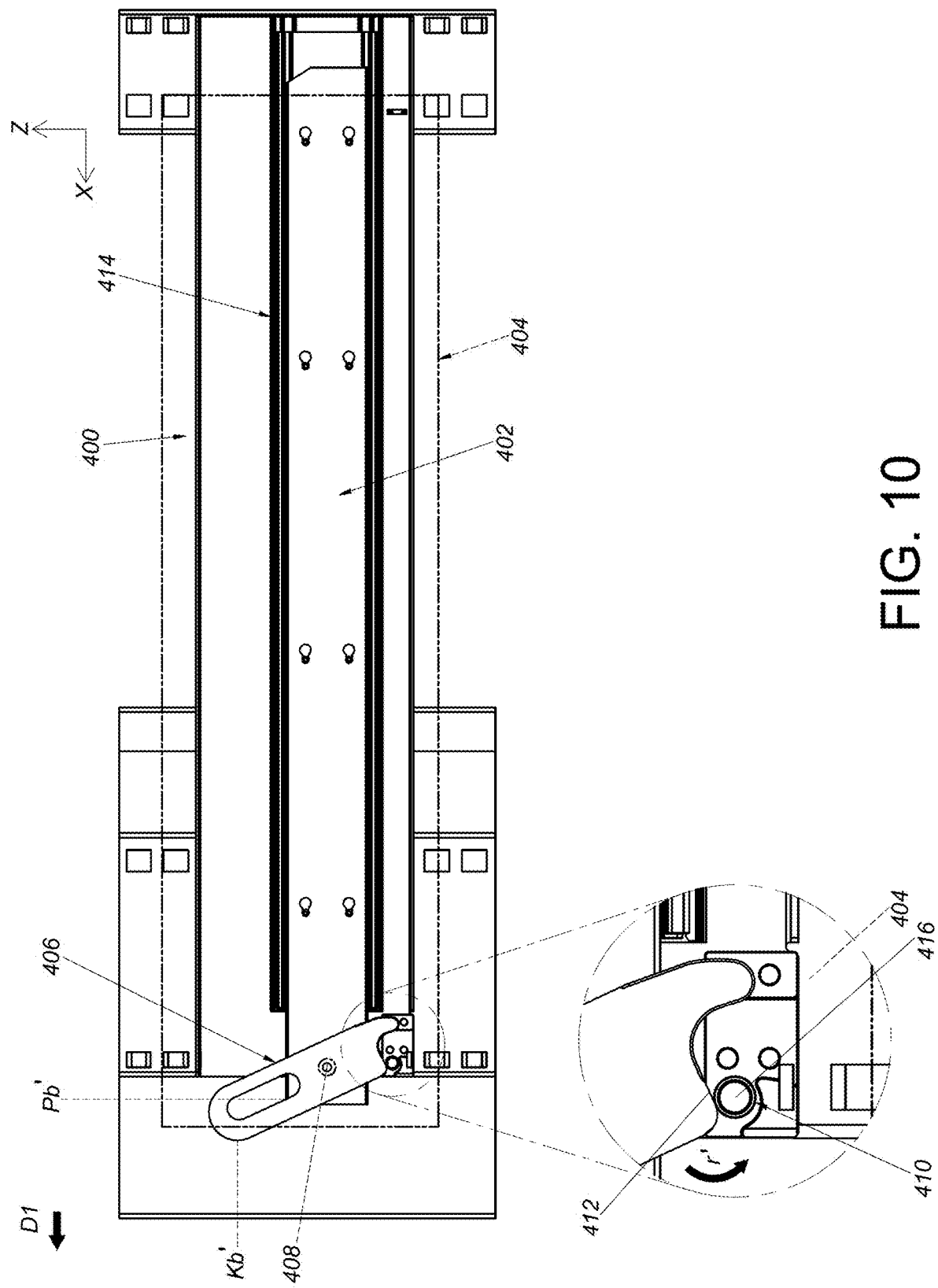
FIG. 10 is a diagram showing a handle being operated to drive the second rail and the carried object to move to the second predetermined position according to the fourth embodiment of the present invention.

FIG. 9 and FIG. 10 are diagrams showing a slide rail assembly 400 according to a fourth embodiment of the present invention. Different from the slide rail assembly 200 of the second embodiment, a second rail 402 of a slide rail assembly 400 of the fourth embodiment is configured to carry a carried object 404, and a handle 406 is movably mounted to the carried object 404. In the present embodiment, the handle 306 is pivotally connected to the carried object 404 through a shaft member 408, but the present invention is not limited thereto. Moreover, the carried object 404 is fixed on the second rail 402, such that the carried object 404 can be seen as a part of the second rail 402, or the carried object 404 and the second rail 402 can be seen as one piece.

During a process of moving the handle 406 from a first operating position Ka' (as shown in FIG. 9) to a second operating position Kb' (as shown in FIG. 10) along a predetermined rotation direction, the handle 406 is configured to contact a supporting feature 410, in order to drive the second rail 402 (and the carried object 404) to move from a first predetermined position Pa' (as shown in FIG. 9) to a second predetermined position Pb' (as shown in FIG. 10). For example, during a process of the user applying a force on the handle 406 to move the handle 406 from the first operating position Ka' to the second operating position Kb', the handle 406 is configured to continuously contact the supporting 410 feature through the first corresponding section 412 to generate an acting force, such that the second rail 402 is configured to be moved relative to the first rail 414 from the first predetermined position Pa' (as shown in FIG. 9) to the second predetermined position Pb' (as shown in FIG. 10) along the opening direction D1. Therefore, the fourth embodiment can achieve substantially the same technical effect as that of the second embodiment.

Moreover, in the fourth embodiment, the supporting feature 410 can be a movable (rotatable) roller. When the handle 406 is moved from the first operating position Ka' to the second operating position Kb', and when the first corresponding section 412 of the handle 406 contacts the supporting feature 410, the supporting feature 410 is configured to rotated along a predetermined working direction r' through an auxiliary shaft 416 (as shown in FIG. 10), such that it is easier to move the handle 406 from the first operating position Ka' to the second operating position Kb'. For the user, the handle 214 can be operated with less effort.

Therefore, the slide rail assembly according to the embodiments of the present invention has the following technical features:

1. Through arrangement of the handle (30, 214, 306, 406) and the supporting feature (26, 202, 310, 410), the user can easily or effortlessly move the slide rail (such as the second rail 28, 216, 302, 402) and/or the carried object (304, 404)

from the first predetermined position (P1, P1', Pa, Pa') to the second predetermined position (P2, P2', Pb, Pb') by using the handle (30, 214, 306, 406).

2. The supporting feature (26, 310) is fixed relative to the first rail (22, 206, 314, 414) and the bracket (24, 204); or the supporting feature (202, 410) is movable (such as rotatable) relative to the first rail (22, 206, 314, 414) and the bracket (24, 204). For example, the supporting feature (202, 410) is movable, such that it is easier to move the handle (214, 406) from the first operating position (K1', Ka') to the second operating position (K2', Kb').

3. The handle (30, 214) is movably mounted on the second rail (28, 216); or the handle (306, 406) is movably mounted on the carried object (304, 404).

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A slide rail assembly, comprising:
a first rail;
a bracket arranged on the first rail;
a supporting feature arranged on one of the bracket and the first rail;
a second rail movable relative to the first rail; and
a handle movable relative to the second rail;
wherein when the handle is moved from a first operating position to a second operating position, the handle is configured to contact the supporting feature in order to drive the second rail to move from a first predetermined position to a second predetermined position relative to the first rail.

2. The slide rail assembly of claim 1, wherein the handle is movably mounted on the second rail.

3. The slide rail assembly of claim 2, wherein the handle is pivoted to the second rail.

4. The slide rail assembly of claim 1, wherein the second rail is configured to carry a carried object, and the handle is movably mounted on the carried object.

5. The slide rail assembly of claim 4, wherein the handle is pivoted to the carried object.

6. The slide rail assembly of claim 1, wherein the supporting feature is fixed to one of the bracket and the first rail.

7. The slide rail assembly of claim 1, wherein the supporting feature is movably mounted to one of the bracket and the first rail.

8. The slide rail assembly of claim 7, wherein the supporting feature is a roller.

9. The slide rail assembly of claim 7, wherein the supporting feature comprises a guiding section.

10. The slide rail assembly of claim 9, wherein the guiding section has an arc surface.

11. The slide rail assembly of claim 1, wherein the handle comprises a first corresponding section; wherein during a process of moving the handle from the first operating position to the second operating position, the handle is configured to continuously contact the supporting feature through the first corresponding section in order to drive the second rail to move from the first predetermined position to the second predetermined position relative to the first rail.

12. The slide rail assembly of claim 11, wherein the handle further comprises a second corresponding section, and a predetermined space is defined between the second corresponding section and the first corresponding section; wherein when the second rail is located at the first predetermined position and when the handle is located at the first operating position, the supporting feature is located in the predetermined space.

13. The slide rail assembly of claim 1, wherein the first rail is configured to be mounted to a rack through the bracket.

14. The slide rail assembly of claim 1, wherein the first rail has a first predetermined height, the bracket comprises a first part, a second part and a longitudinal part connected between the first part and the second part, and the first part and the second part of the bracket define a second predetermined height greater than the first predetermined height.

15. The slide rail assembly of claim 14, wherein the longitudinal part of the bracket is connected to the first rail.

16. The slide rail assembly of claim 14, wherein the second rail comprises a first wall, a second wall and a longitudinal wall connected between the first wall and the second wall; wherein the handle is movably mounted on the longitudinal wall of the second rail.

17. The slide rail assembly of claim 16, wherein the supporting feature is arranged on the longitudinal part of the bracket, and the supporting feature is adjacent to one of the first part and the second part of the bracket.

18. A slide rail assembly, comprising:
a first rail;
a second rail configured to be located at a retracted position relative to the first rail;
a supporting feature arranged on one of the first rail and the second rail; and
a handle movably mounted on the other one of the first rail and the second rail;
wherein when the handle is moved from a first operating position to a second operating position, the handle is configured to contact the supporting feature in order to drive the second rail to move away from the retracted position relative to the first rail along an opening direction.

19. The slide rail assembly of claim 18, wherein the second rail is configured to carry a carried object, and the handle is movably mounted on one of the second rail and the carried object.

20. The slide rail assembly of claim 18, wherein the supporting feature is arranged on a bracket mounted on the first rail; wherein the first rail has a first predetermined height, the bracket has a second predetermined height greater than the first predetermined height; wherein the second rail comprises a first wall, a second wall and a longitudinal wall connected between the first wall and the second wall; wherein the handle is movably mounted on the longitudinal wall of the second rail.

* * * * *